(12) United States Patent
Kim

(10) Patent No.: US 7,989,908 B2
(45) Date of Patent: Aug. 2, 2011

(54) IMAGE SENSOR AND METHOD FOR MANUFACTURING THE SAME

(75) Inventor: Seoung Hyun Kim, Gyeongi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 780 days.

(21) Appl. No.: 12/001,650

(22) Filed: Dec. 11, 2007

(65) Prior Publication Data

US 2008/0157087 A1 Jul. 3, 2008

(30) Foreign Application Priority Data

Dec. 27, 2006 (KR) .......................... 10-2006-0134766

(51) Int. Cl.
*H01L 31/00* (2006.01)
*H01L 31/0232* (2006.01)

(52) U.S. Cl. . 257/440; 257/432; 257/443; 257/E31.121; 438/70

(58) Field of Classification Search .................. 257/432, 257/440, 443, E31.121; 438/65, 66, 70
See application file for complete search history.

(56) References Cited

U.S. PATENT DOCUMENTS

| | | | |
|---|---|---|---|
| 4,675,727 A * | 6/1987 | Sekizawa et al. ............. 358/533 |
| 7,091,463 B2 * | 8/2006 | Suzuki et al. ............... 250/208.1 |
| 7,126,099 B2 * | 10/2006 | Hsu et al. .................... 250/208.1 |
| 7,158,746 B2 | 1/2007 | Swift | |
| 7,199,347 B2 * | 4/2007 | Li et al. ....................... 250/208.1 |
| 7,205,526 B2 * | 4/2007 | Li et al. ............................ 250/216 |
| 7,253,394 B2 * | 8/2007 | Kang .............................. 250/216 |
| 7,403,228 B2 | 7/2008 | Kamimura et al. | |
| 7,656,453 B2 * | 2/2010 | Nishi ............................. 348/340 |
| 2003/0132367 A1 * | 7/2003 | Suzuki et al. ............... 250/208.1 |
| 2005/0035377 A1 | 2/2005 | Kamimura et al. | |
| 2005/0045803 A1 * | 3/2005 | Hsu et al. .................... 250/208.1 |
| 2005/0103983 A1 * | 5/2005 | Yamaguchi et al. ........ 250/214.1 |
| 2005/0133688 A1 * | 6/2005 | Li et al. ....................... 250/208.1 |

(Continued)

FOREIGN PATENT DOCUMENTS

JP 2000349268 A 12/2000

(Continued)

OTHER PUBLICATIONS

Jeong Lyeol Park; Image Sensor with Improved Blue Light Sensitivity to Improve Light Sensitivity of Blue Color Having Relatively Weak Light Sensitivity; Korean Patent Abstracts; Publication No. 1020050122746 A; Publication Date: Dec. 29, 2005; Korean Intellectual Property Office.

(Continued)

*Primary Examiner* — Steven Loke
*Assistant Examiner* — Earl N Taylor
(74) *Attorney, Agent, or Firm* — The Law Offices of Andrew D. Fortney; Andrew D. Fortney

(57) ABSTRACT

Provided is an image sensor. The image sensor includes a semiconductor substrate, photodiode structures, color filters, and microlenses. The semiconductor substrate includes a first region having pixel regions and a second region around the first region. The pixel regions are arranged in a matrix configuration. Each of the photodiode structures has a photodiode in each of the pixel regions. The color filters are disposed on or over the photodiode structures, the color filters correspond to the pixel regions, respectively, and have different areas corresponding to incident angles of light.

16 Claims, 5 Drawing Sheets

U.S. PATENT DOCUMENTS

| | | | |
|---|---|---|---|
| 2005/0265756 A1 | 12/2005 | Swift | |
| 2006/0027734 A1* | 2/2006 | Li et al. | 250/208.1 |
| 2006/0192262 A1 | 8/2006 | Kikuchi | |
| 2007/0164329 A1* | 7/2007 | Toshikiyo | 257/291 |
| 2008/0265349 A1* | 10/2008 | Kasano et al. | 257/432 |

FOREIGN PATENT DOCUMENTS

| | | | | |
|---|---|---|---|---|
| JP | 2005338832 A | | 12/2005 | |
| JP | 2006086356 A | | 3/2006 | |
| JP | 2006237361 A | | 9/2006 | |
| JP | 2009164385 A | * | 7/2009 | |
| KR | 10-2005-0066737 | | 6/2005 | |
| KR | 10-2005-0122746 | | 12/2005 | |

OTHER PUBLICATIONS

Young Rok Kim; Image Sensor and Method for Fabricating the Same to Normally Form Photo Charges Caused by Red Light in Effective Depletion Region of Photodiode; Korean Patent Abstracts; Publication No. 1020050066737 A; Publication Date: Jun. 30, 2005; Korean Intellectual Property Office.

Japanese Office Action dated Mar. 29, 2011; Japanese Patent Application No. 2007-326818; Japan Patent Office, Japan.

Shinya Kamimura, Masafumi Inoue; "Solid-State Image Pickup Device, Manufacture Thereof and Manufacture of Mask"; esp@cenet; Japanese Publication No. JP 2000349268 (A); Publication Date: Dec. 15, 2000; esp@cenet Database—Worldwide; http://worldwide.espacenet.com/publicationDetails/biblio?DB=EPODOC&adjacent=true.

Joseph A Swift; "Electrophotography Transfer Station Using Semiresistive Brush"; esp@cenet; Japanese Publication No. JP 2005338832 (A); Publication Date: Dec. 8, 2005; esp@cenet Database—Worldwide; http://worldwide.espacenet.com/publicationDetails/biblio?DB=EPODOC&adjacent=true.

Satoshi Suzuki; "Solid-State Imaging Device"; esp@cenet; Japanese Publication No. JP 2006086356 (A); Publication Date: Mar. 30, 2006; esp@cenet Database—Worldwide; http://worldwide.espacenet.com/publicationDetails/biblio?DB=EPODOC&adjacent=true.

Norio Kikuchi; "CMOS Image Sensor"; esp@cenet; Japanese Publication No. JP 2006237361 (A); Publication Date: Sep. 7, 2006; esp@cenet Database—Worldwide; http://worldwide.espacenet.com/publicationDetails/biblio?DB=EPODOC&adjacent=true.

* cited by examiner

IMAGE SENSOR AND METHOD FOR MANUFACTURING THE SAME

CROSS-REFERENCE TO RELATED APPLICATIONS

The present application claims the benefit under 35 U.S.C. §119 of Korean Patent Application No. 10-2006-0134766, filed Dec. 27, 2006, which is hereby incorporated by reference in its entirety.

BACKGROUND

A related art image sensor includes color filters and microlenses arranged to correspond to respective photodiodes. In the related art image sensor, plane areas of the microlenses may be substantially the same as those of the color filters. Also, the microlenses of the related art image sensor have a convex lens shape to condense incident light.

However, since the areas of the microlenses are generally the same as those of the color filters and the microlenses have a convex lens shape, light incident to the microlenses is refracted by the microlenses, passes through the color filters, and can be incident to adjacent photodiodes, which generates crosstalk.

The crosstalk is frequently generated at or near pixel edges, or at or near the outermost peripheral pixels of an image sensor, rather than the central portion of the image sensor. The reason crosstalk is generated in the outermost pixels or pixel edges, rather than the central portion of the image sensor, is that the slope of light incident to the edges of the pixels (or the pixel area of the image sensor) is greater than that of the light incident to the central portion.

SUMMARY

Embodiments provide an image sensor and a method for manufacturing the same, that can reduce or remove crosstalk caused by light interference to improve image quality.

In one embodiment, an image sensor includes a semiconductor substrate including a first (central) pixel region and a second (peripheral) pixel region around the first region, the pixel regions having a matrix configuration; a photodiode in each of the pixel regions; color filters corresponding to the pixel regions, having an area corresponding to an incident angle of light; and microlenses on or over the color filters.

In another embodiment, a method for manufacturing an image sensor includes preparing a semiconductor substrate including a first (central) pixel region and a second (peripheral) region around the first region, the pixel regions having a matrix configuration; forming a photodiode in each of the pixel regions; forming color filters corresponding to the pixel regions, having an area corresponding to an incident angle of light; and forming microlenses on the color filters.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to various embodiments of the present disclosure, examples of which are illustrated in the accompanying drawings.

In the description of the various embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Figure 1:
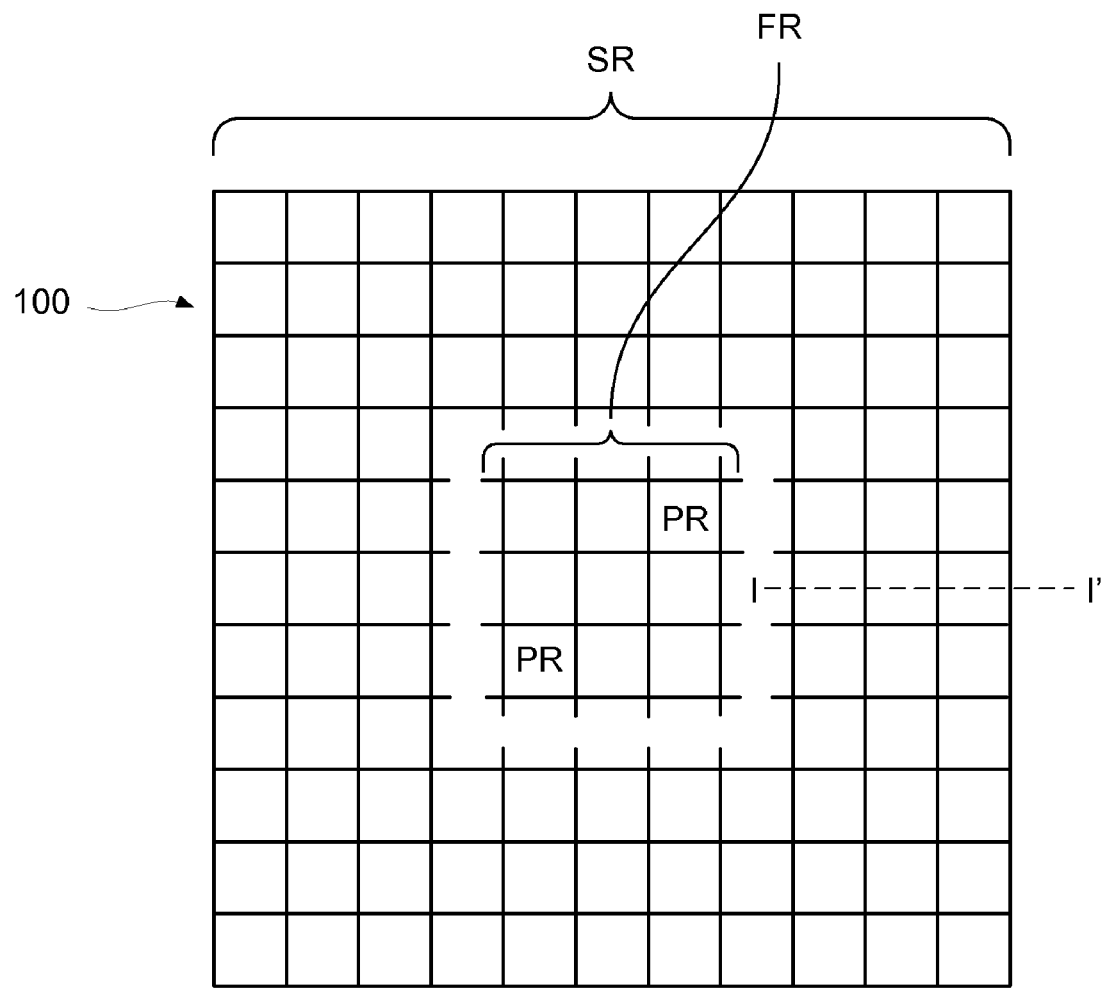
FIG. 1 is a plan view of an image sensor according to an embodiment.
Figure 2:
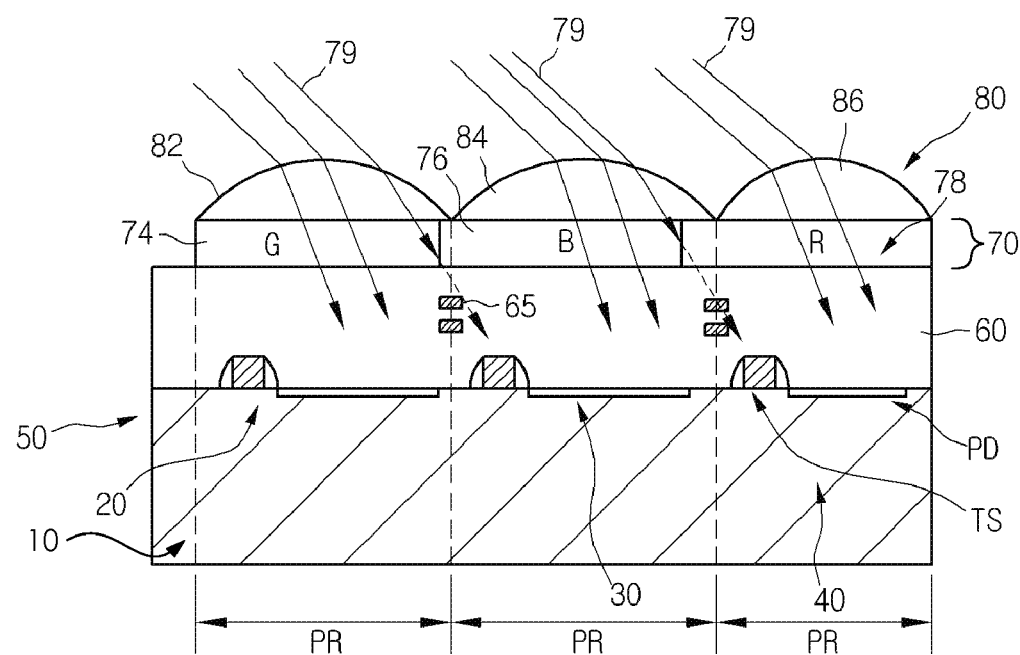
FIG. 2 is a cross-sectional view taken along a line I-I' of FIG. 1.
Figure 3:
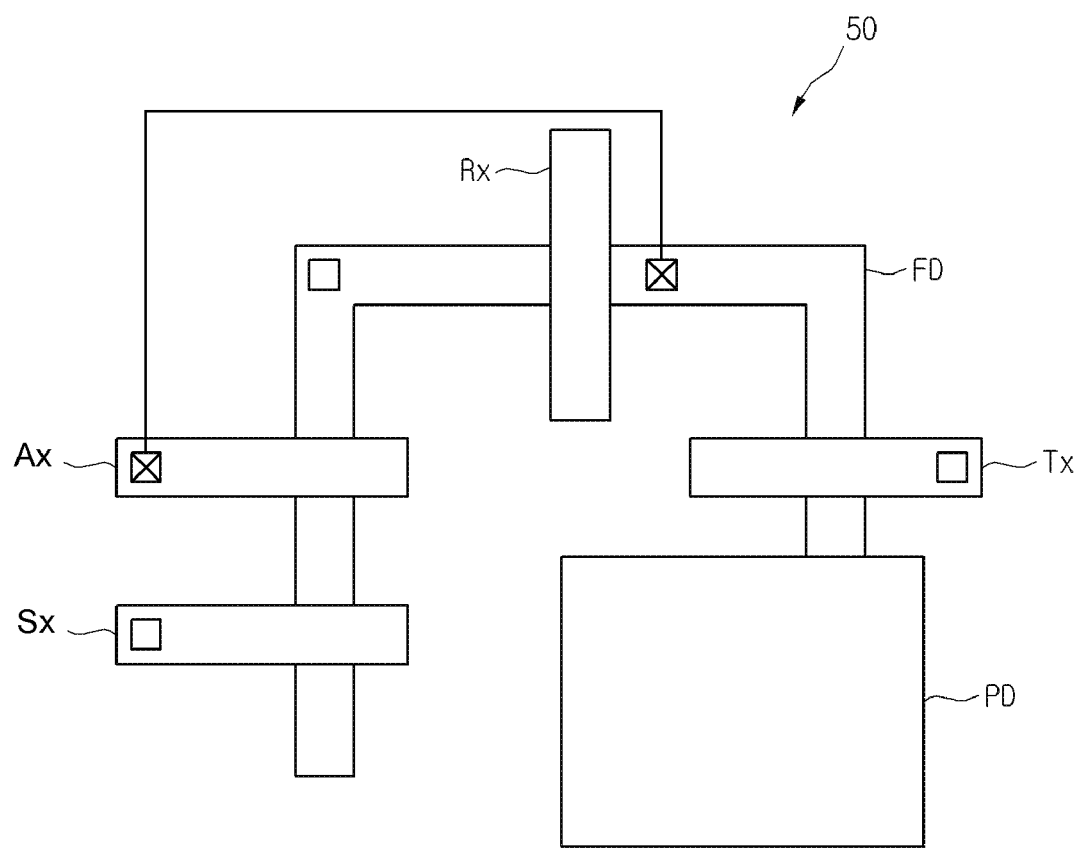
FIG. 3 is a plan or layout view illustrating a unit pixel of the image sensor of FIG. 1.

FIG. 1 is a plan view of an image sensor according to an exemplary embodiment of the invention. FIG. 2 is a cross-sectional view taken along a line I-I' of FIG. 1. FIG. 3 is a plan view illustrating an exemplary unit pixel of the image sensor of FIG. 1.

Referring to FIGS. 1 and 2, the image sensor 100 includes a semiconductor substrate 10 including a first (central) region FR having a plurality of pixel regions PR arranged in a matrix configuration, and a second (peripheral) region SR surrounding the first region FR. The second (peripheral) region SR also includes a plurality of pixel regions arranged in a matrix configuration, typically the same matrix as the pixel regions PR in the first (central) region FR.

Referring to FIG. 2, a photodiode structure portion 50 including first to third photodiode structures 20, 30, and 40 disposed in each of the pixel regions PR. Each photodiode structure includes a photodiode PD and a transistor structure TS. The transistor structure TS generally includes a plurality of transistors (e.g., from 3 to 5 transistors per unit pixel).

Referring to FIG. 3, each transistor structure TS included in the photodiode structure may include a transfer transistor Tx, a reset transistor Rx, a select transistor Sx, and an access transistor Ax. A drain of the transfer transistor Tx serves as a floating diffusion layer FD.

Referring to FIG. 2 again, after the photodiode structure 50 is formed on the semiconductor substrate 10, an insulating layer structure 60 covering the photodiode structure portion 50 is formed on the semiconductor substrate 10. The insulating layer structure 60 can include a wiring structure 65. In an embodiment, the insulating layer structure 60 can be included in the photodiode structure portion 50.

Referring to FIG. 2 again, color filter layer 70 can be formed on the insulating layer structure 60 of the photodiode structure portion 50. In an embodiment, the color filter layer 70 includes a first color filter 74, a second color filter 76, and a third color filter 78. In an embodiment, the first color filter 74 is a green color filter for transmitting light having a wavelength corresponding to green color, the second color filter 76 is a blue color filter for transmitting light having a wavelength corresponding to blue color, and the third color filter 78 is a red color filter for transmitting light having a wavelength corresponding to red color. Alternatively, the first color filter 74, second color filter 76, and third color filter 78 may include yellow, cyan and magenta color filters.

In an embodiment, the first color filter 74 is disposed on a portion of the insulating layer structure 60 that corresponds to the first photodiode structure 20, the second color filter 76 is disposed on a portion of the insulating layer structure 60 that corresponds to the second photodiode structure 30, and the third color filter 78 is disposed on a portion of the insulating layer structure 60 that corresponds to the third photodiode structure 40.

In an embodiment, the first to third color filters 74, 76, and 78 have a different plane area, depending on a corresponding incident angle of incident light 79. For example, the plane areas of the color filters 74, 76 and 78 may gradually decrease toward the central portion of the first region FR from the outer boundary of the second region SR illustrated in FIG. 1. This is because an incident angle of light onto microlenses in the central portion (or the first region FR) is generally near or about 90°, and thus, different from that of light incident onto microlenses in the second (peripheral) region SR (which can be as high as 30 to 45° or more).

In an embodiment, the third color filter 78 has a first plane area, the second color filter has a second plane area smaller than the first plane area, and the first color filter 74 has a third plane area smaller than the second plane area. Alternatively, if all unit pixels PR have the same area, the color filters in the first (central) region have a first area, the color filters in the second (peripheral) region other than the outermost color filters have a second area slightly smaller than the first area (e.g., to generate an offset between each color filter and the corresponding photodiode PD that is a substantially linear function of the distance from the first area and/or the angle of incident light), and the outermost color filters have a third area greater than the first area.

Microlenses 80 are disposed on the first to third color filters 74, 76, and 78, respectively. In an embodiment, the microlenses 80 include a first microlens 82, a second microlens 84, and a third microlens 86. In an embodiment, the first microlens 82 corresponds to the first photodiode structure 20 and the first color filter 74. The second microlens 84 corresponds to the second photodiode structure 30 and the second color filter 76. The third microlens 86 corresponds to the third photodiode structure 40 and the third color filter 78. In a further embodiment, the plane area of the third microlens 86 is smaller than that of the third color filter 78.

In an exemplary embodiment, the first to third color filters 74, 76, and 78, respectively, are disposed under the first to third microlenses 82, 84, and 86 having the same area to allow light that has passed through the first to third microlenses 82, 84, and 86, and the first to third color filters 74, 76, and 78 to be incident onto corresponding photodiodes, respectively. Therefore, crosstalk generation can be reduced or prevented.

In detail, for example, light that has passed through the second microlens 84 is incident onto the second color filter 76. At this point, only the blue light of the white light incident onto the second microlens 84 is output after it passes through the second color filter 76. At this point, the blue light that has passed through the second color filter is mostly incident onto the second photodiode structure 30, but a portion of the blue light may be incident onto the third photodiode structure 40 adjacent to the second photodiode structure 30 in the absence of the present invention. At this point, the portion of the blue light directed to the third photodiode structure 40 passes into the third color filter 78, and is absorbed by the third color filter 78. Therefore, the blue light is not incident onto the third photodiode structure 40, so that crosstalk is prevented.

Thus, in an alternative embodiment, the offset between a border of a color filter in an adjacent unit pixel (e.g., the border of color filter 74 in unit pixel 20 closest to unit pixel 30) and the border between two adjacent unit pixels (e.g., the vertical dashed line between unit pixels 20 and 30) can be filled in with a light-absorptive or -reflective material (e.g., metal or a photoresist containing a black pigment), but such extra processing is typically not necessary to accomplish the effects of the invention.

Figure 4:
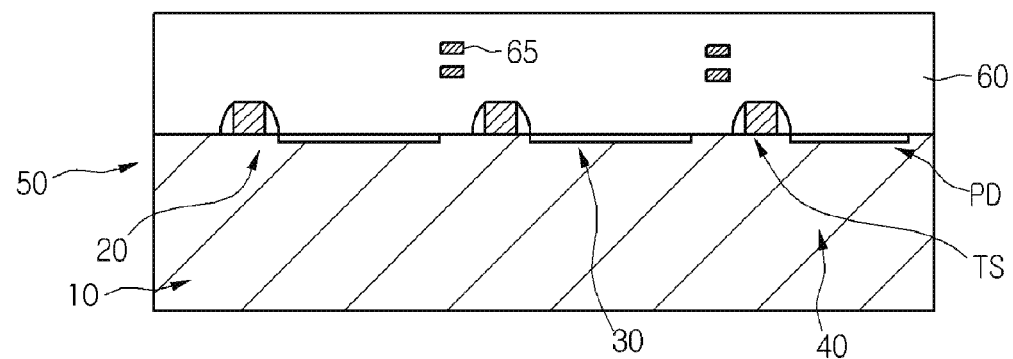
FIGS. 4 to 6 are cross-sectional views explaining a method for manufacturing an image sensor according to exemplary embodiments.
Figure 5:
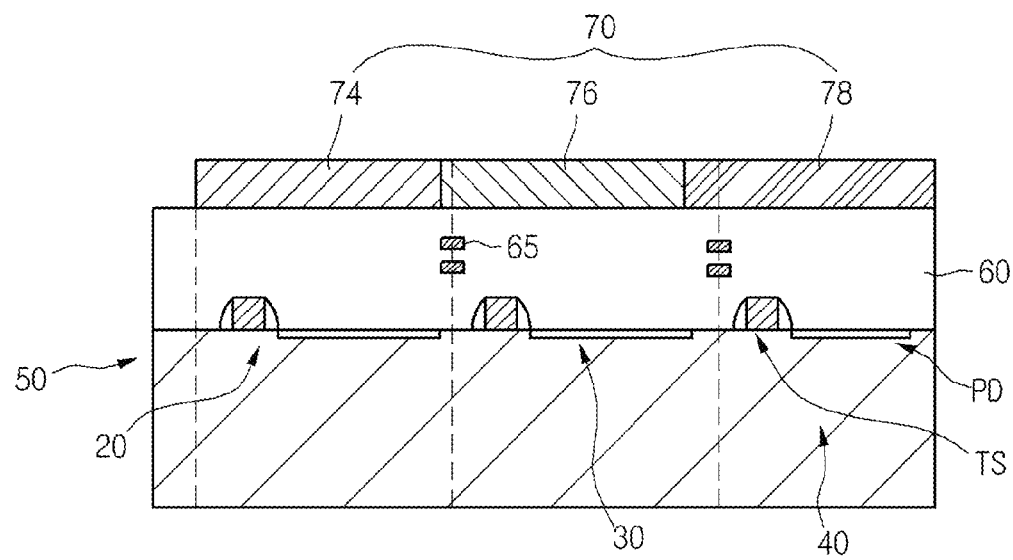
Figure 6:
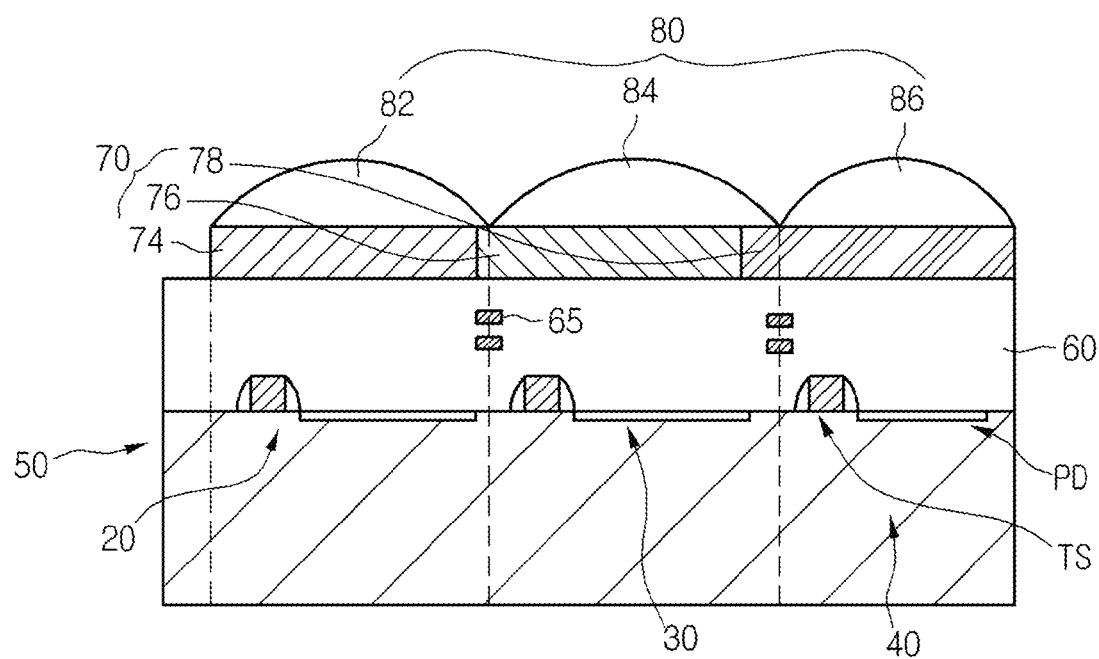

FIGS. 4 to 6 are cross-sectional views explaining a method for manufacturing an image sensor according to an embodiment.

Referring to FIG. 4, a photodiode structure portion 50 including a first to third photodiode structures 20, 30, and 40 is formed on a semiconductor substrate 10. Each of the first to third photodiode structures 20, 30, and 40 includes a photodiode PD and a transistor structure TS.

After the photodiode structures each having the photodiode PD and the transistor structure TS are formed on the semiconductor substrate 10, an insulating layer structure 60 covering the photodiode structure portion 50 can be formed on the semiconductor substrate 10. The insulating layer structure 60 can include one or more wiring structures 65. The insulating layer structure 60 can comprise a plurality of multilayer insulators, and the wiring structures 65 can be formed in such multilayer insulators in accordance with techniques known in the art (e.g., photolithographic patterning and etching of a metal layer deposited on an insulator, damascene or dual damascene metallization in a multilayer insulator, etc.).

As shown in FIG. 5, color filters 70 are formed on the insulating layer structure 60 of the photodiode structure portion 50. In an embodiment, the color filters 70 include a first color filter 74, a second color filter 76, and a third color filter 78. In a further embodiment, the first color filter 74 for transmitting light having a wavelength corresponding to green light is disposed on a portion of the insulating layer structure 60 that corresponds to the first photodiode structure 20, the second color filter 76 for transmitting light having a wavelength corresponding to blue light is disposed on a portion of the insulating layer structure 60 that corresponds to the second photodiode structure 30, and the third color filter 78 is disposed on a portion of the insulating layer structure 60 that corresponds to the third photodiode structure 40.

In an even further embodiment, the first to third color filters 74, 76, and 78 have a different plane area depending on a corresponding incident angle of incident light 79. For example, the plane areas of the color filters 70 may gradually decrease toward the central or first region FR from the second region SR, as illustrated in FIG. 1. This is because an incident angle of light onto the central portion (or first region FR) is different from that of light incident onto the second region SR.

In an embodiment, the third color filter 78 may have a first plane area, the second color filter may have a second plane area smaller than the first plane area, and the third color filter 74 may have a third plane area smaller than the second plane area.

Referring to FIG. 6, microlenses 80 are disposed on the first to third color filters 74, 76, and 78, respectively. In an embodiment, the microlenses 80 include a first microlens 82, a second microlens 84, and a third microlens 86. In a further embodiment, the first microlens 82 corresponds to the first photodiode structure 20 and the first color filter 74. The second microlens 84 corresponds to the second photodiode structure 30 and the second color filter 76. The third microlens 86 corresponds to the third photodiode structure 40 and the third color filter 78. In an embodiment, the plane area of the third microlens 86 is formed smaller than that of the third color filter 78.

In an even further embodiment, the first to third color filters 74, 76, and 78, respectively, are disposed under the first to third microlenses 82, 84, and 86 having the same area to allow light that has passed through the first to third microlenses 82, 84, and 86, and the first to third color filters 74, 76, and 78 to be incident onto corresponding photodiode structures, respectively. Therefore, crosstalk generation can be reduced or prevented, as described above.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
    a semiconductor substrate including first and second regions each having pixel regions, the second region around the first region, and the pixel regions having a matrix configuration;
    a photodiode in each of the pixel regions;
    color filters corresponding to the pixel regions, respectively, wherein a plane area of each of the color filters increases along a direction from the first region to the second region; and
    microlenses on the color filters.

2. The image sensor according to claim 1, wherein plane areas of outermost color filters in the second region are greater than plane areas of the corresponding microlenses.

3. The image sensor according to claim 1, wherein plane areas of the microlenses are the same as those of the pixel regions.

4. The image sensor according to claim 1, wherein the plane area of each pixel region is the same as the plane area of each corresponding microlense, and the plane area of the color filters decreases along a direction from the second region to the first region.

5. The image sensor according to claim 1, wherein the microlenses comprise a first microlens, a second microlens, and a third microlens.

6. The image sensor according to claim 5, wherein:
    the first microlens corresponds to a first photodiode and a first color filter;
    the second microlens corresponds to a second photodiode and a second color filter; and
    the third microlens corresponds to a third photodiode and a third color filter.

7. The image sensor according to claim 6, wherein the third color filter has a first plane area, the second color filter has a second plane area smaller than the first plane area, and the first color filter has a third plane area smaller than the second plane area.

8. The image sensor according to claim 1, wherein each of the pixel regions has a same plane area.

9. The image sensor according to claim 8, wherein:
    each of the color filters in the first region has a first plane area; and
    each of the color filters in an outermost region of the second region has a second plane area greater than the first plane area.

10. The image sensor according to claim 1, wherein an offset between a border of a color filter in a first pixel region and a border between the first pixel region and an adjacent pixel regions is filled with a light absorptive or reflective material.

11. The image sensor according to claim 1, further comprising an insulating layer on the semiconductor substrate over the photodiode.

12. The image sensor according to claim 11, further comprising a wiring structure in the insulating layer.

13. The image sensor according to claim 11, wherein each of the color filters is on a portion of the insulating layer that covers the corresponding photodiode.

14. The image sensor according to claim 1, wherein the pixel regions each comprise a photodiode and a plurality of transistors.

15. The image sensor according to claim 14, wherein the plurality of transistors comprise a transfer transistor, a reset transistor, a select transistor, and an access transistor.

16. The image sensor according to claim 1, wherein the first region and the second region are in the same matrix.

* * * * *